United States Patent
Mandelman et al.

(10) Patent No.: US 6,274,441 B1
(45) Date of Patent: Aug. 14, 2001

(54) METHOD OF FORMING BITLINE DIFFUSION HALO UNDER GATE CONDUCTOR LEDGE

(75) Inventors: Jack A. Mandelman, Stormville; Ramachandra Divakaruni, Somers, both of NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/560,073

(22) Filed: Apr. 27, 2000

(51) Int. Cl.⁷ .................................................... H01L 21/70
(52) U.S. Cl. ......................... 438/286; 438/306; 438/291
(58) Field of Search .................................. 438/286, 306, 438/291, FOR 212

(56) References Cited

U.S. PATENT DOCUMENTS

| | | |
|---|---|---|
| 5,395,773 | 3/1995 | Ravindhran et al. . |
| 5,439,835 | 8/1995 | Gonzalez . |
| 5,492,847 | 2/1996 | Kao et al. . |
| 5,683,927 | 11/1997 | Dennison et al. . |
| 5,753,958 * | 5/1998 | Bur et al. . |
| 5,759,901 | 6/1998 | Loh et al. . |
| 5,834,355 | 11/1998 | Doyle . |
| 5,843,815 | 12/1998 | Liaw . |
| 5,891,782 | 4/1999 | Hsu et al. . |
| 5,899,732 | 5/1999 | Gardner et al. . |
| 5,930,615 | 7/1999 | Manning . |
| 6,008,080 * | 12/1999 | Chuang et al. . |
| 6,046,472 * | 4/2000 | Ahmad et al. . |

* cited by examiner

Primary Examiner—George Fourson
Assistant Examiner—Thanh V Pham
(74) Attorney, Agent, or Firm—Steven Capella; Cantor Colburn LLP

(57) ABSTRACT

A method for fabricating a MOSFET device including a halo implant comprising providing a semiconductor substrate, a gate insulator layer, a conductor layer, an overlying silicide layer, and an insulating cap; patterning and etching the silicide layer and the insulating cap; providing insulating spacers along sides of said silicide layer and insulating cap; implanting node and bitline N+ diffusion regions; patterning a photoresist layer to protect the node diffusion region and supporting PFET source and drain regions and expose the bitline diffusion region and NFET source and drain regions; etching exposed spacer material from the side of said silicide layer and insulating cap; implanting a P-type impurity halo implant into the exposed bitline diffusion region and supporting NFET source and drain regions; and stripping the photoresist layer and providing an insulating spacer along the exposed side of said silicide layer and insulating cap.

10 Claims, 7 Drawing Sheets

METHOD OF FORMING BITLINE DIFFUSION HALO UNDER GATE CONDUCTOR LEDGE

BACKGROUND OF THE INVENTION

The present invention relates to a method of fabricating a metal oxide semiconductor field effect transistor (MOSFET) device for a dynamic random access memory (DRAM) cell, and more particularly, to a method for forming a P-type halo implant surrounding the N+ bitline diffusion region of such device.

Over the last several years, significant advances have occurred in increasing the circuit density in integrated circuit chip technology. The ability to provide significantly increased numbers of devices and circuits on an integrated circuit chip has, in turn, created an increased desire to incorporate or integrate additional system functions onto a single integrated circuit chip. In particular, an increasing need exists for joining both memory circuits and logic circuits together on the same integrated circuit chip.

As minimum feature size and cell architecture (i.e. number of squares) are scaled down, robust design points for DRAM cells utilizing planar MOSFETs and deep storage capacitors are increasingly difficult to achieve. Scalability of the planar MOSFET in this environment is severely limited by reliability imposed constraints on minimum gate insulator thickness and poor scalability of physical attributes such as buried strap outdiffusion, active area (AA) and gate conductor (GC) critical dimension, GC-deep trench (DT) overlay tolerance, and shallow trench isolation (STI) recess control. One manifestation of the scalability difficulties of planar DRAM MOSFETs is degradation of the retention time tail, due to increased junction leakage resulting from the very high channel doping concentrations, which are required to suppress short-channel effects.

Another problem associated with scaling the design channel length of the array MOSFET is large threshold voltage ($V_t$) variation due to operation on the steep portion of the $V_t$ rolloff curve. Due to variations in GC critical dimension (CD) and GC-DT overlay, the drain induced barrier effect (DIBL) from the proximity of the bitline diffusion to buried strap diffusion result in a variation of threshold voltage. With aggressively scaled channel lengths, operation on the steep portion of the rolloff curve occurs since the gate oxide thickness and the strap junction depth of the array MOSFET are very difficult to scale. As a result of amplified variation in threshold voltage the amount of charge that can be written to the storage capacitor is reduced. This reduction in stored charge results in decreased product yield.

To meet the performance objectives in contemporary DRAMs it is necessary to provide support MOSFETs having source-drain diffusions, which are contacted with low-resistance (tungsten) studs. Because of the relatively low doping concentration required for the storage node diffusion in the array (to contain junction leakage) and a process which simultaneously forms the bitline diffusion and node diffusion, metal studs cannot be used for the array MOSFET; doped polysilicon studs are customarily used. If tungsten studs were also used for contacting the array MOSFETs, very high junction leakage would result because of tungsten penetration into the junction.

Thus, there is no current effective, economically attractive process for providing a MOSFET with improved threshold voltage ($V_t$) control without increased node diffusion leakage.

SUMMARY OF THE INVENTION

Now, according to the present invention, a novel method is provided for forming a P-type halo implant surrounding the N+ bitline diffusion region of a MOSFET device. Since the threshold voltage and short-channel effects of the array MOSFET are dominated by this halo, the normally implanted channel doping concentration may be greatly reduced. Thus, improved array $V_t$ control can be achieved without increased node diffusion leakage.

The non-uniform channel doping concentration in the lateral direction between bitline and node diffusion, resulting from the presence of the halo, produces a significant flattening of the $V_t$ rolloff as the channel length is reduced. Thus, stored charge and product yield are increased.

The present method comprises providing a semiconductor substrate, a gate insulator layer over said semiconductor substrate, a conductor layer comprising polysilicon, an overlying silicide layer over said conductor layer, and an insulating cap over said silicide layer; providing insulating spacers comprising spacer material along sides of said silicide layer and insulating cap; implanting node and bitline N+ diffusion regions; patterning a photoresist layer to protect the node diffusion region and PFET source and drain regions and expose the bitline diffusion region and NFET source and drain regions; etching exposed spacer material from the side of said silicide layer and insulating cap; implanting a P-type dopant halo implant into the exposed bitline diffusion region and NFET source and drain regions; and stripping the photoresist layer and providing an insulating spacer comprising spacer material along the exposed side of said silicide layer and insulating cap.

Accordingly, the present invention allows the P-well doping concentration in the vicinity of the node diffusion to be safely reduced, thereby improving the retention time yield. The invention also reduces the steepness of the $V_t$ rolloff curve, thereby improving $V_t$ tolerance.

Still another problem solved by the present invention is the high process complexity required to form diffusions in the array, which are contacted by polysilicon studs, and in the same process form support MOSFET diffusions contacted by tungsten studs.

The present process allows a relatively high doping concentration for the bitline diffusion while maintaining a much lower concentration for the node diffusion, thus allowing tungsten studs in the array. As a result of the reduced process complexity, manufacturing costs can be reduced.

BRIEF DESCRIPTION OF THE DRAWINGS

For further understanding of the present invention, reference should be made to the following detailed description of the preferred embodiments taken in conjunction with the accompanying drawings in which like elements have been designated with like reference numerals, and wherein.

DETAILED DESCRIPTION OF THE INVENTION

Figure 1:
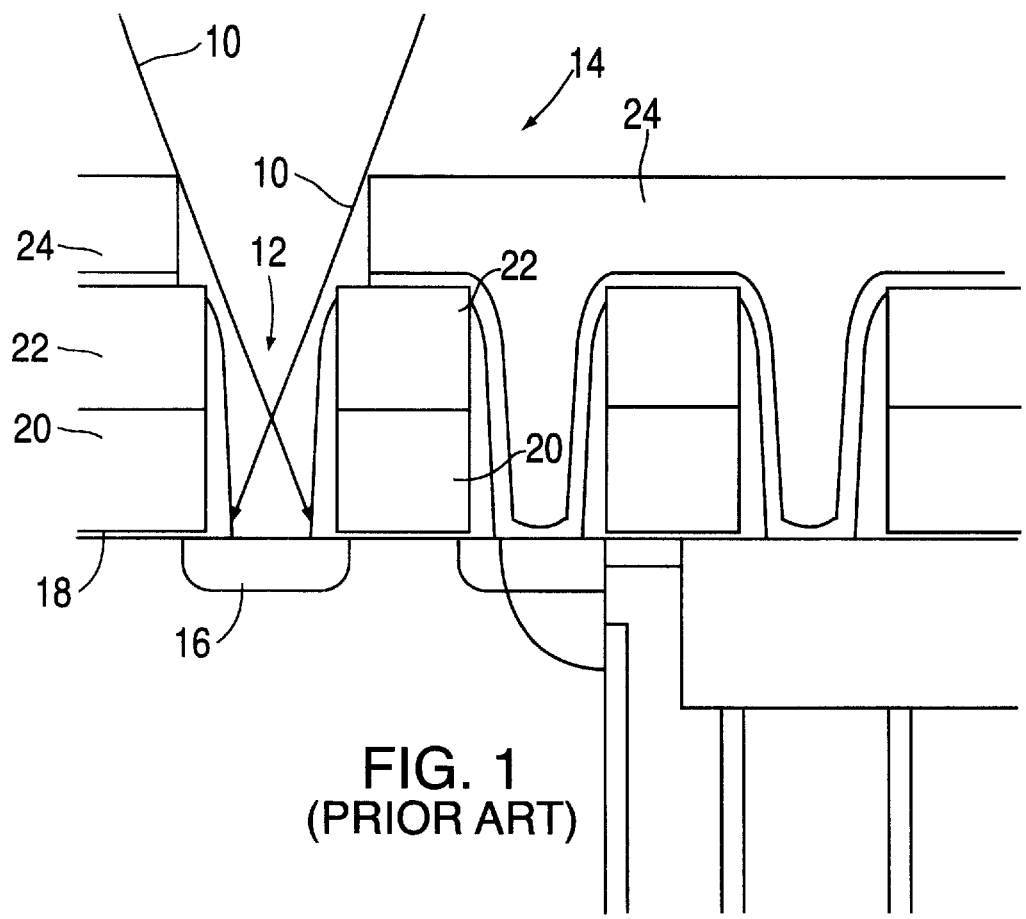
FIG. 1 is a cross-sectional view of a conventional memory cell array showing an angled implantation doping scheme.
Figure 2:
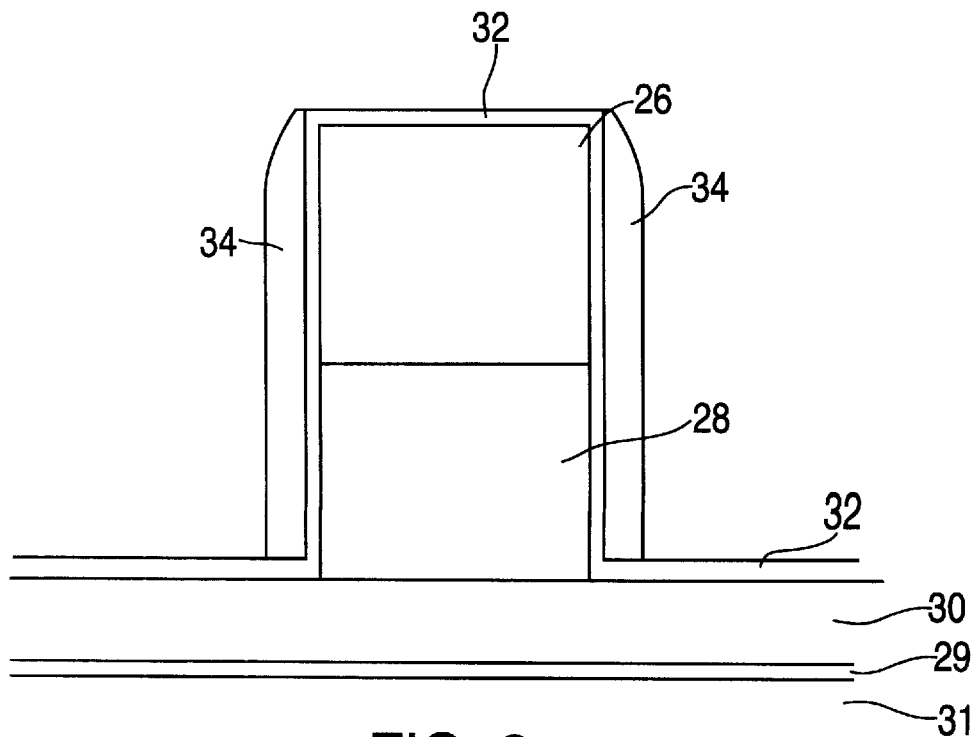
FIGS. 2–7 illustrate steps of forming a memory cell according to the method of the present invention.

Referring to the drawings, FIG. 1 illustrates the use of angled implantation 10 to implant a P-type impurity species, such as boron, into a bitline contact (CB) opening 12 in an array 14 of MOSFET devices in order to form a halo implant surrounding the bitline diffusion region 16. The difficulty with this approach is that shadowing from the high gate stack height of gate oxide layer 18, gate conductor layer 20, a nitride cap 22, and overlying insulator 24 limits the implant to very steep angles. The steep implantation angle prevents the boron dopant from diffusing ahead of the phosphorus from the bitline diffusion. Thus only a weak halo is formed, at best. FIGS. 2–7 depict one embodiment of a formation process according to the present invention for accomplishing a strong halo implant surrounding the bitline diffusion region. Turning to FIG. 2, the process follows conventional fabricating techniques through gate stack deposition. This includes shallow trench isolation (STI) definition, sacrificial oxide formation, well implants, gate oxide formation and gate conductor stack deposition. A gate conductor mask, such as a layer of resist material of the type commonly employed in known lithographic masking and etching techniques, is placed over nitride cap 22. The resist material typically is applied by standard spinning or spraying methods. The gate stack is patterned and reaction ion etched (RIE'd) through the cap nitride and tungsten silicide (WSi$_x$) layers stopping approximately on the surface N+ polysilicon 30 covering gate oxide layer 29 and silicon substrate 31. The thickness of the exposed portion of the N+ polysilicon preferably ranges from 25 to 100 nm. A thin layer of nitride 32 is deposited, followed by a layer of arsenic silicate glass (ASG) (or other suitable doped glass, which may be easily etched). The thickness of the ASG is preferably about 15 to 30 nm. Then the ASG is RIE'd, stopping on the thin nitride layer 32, to form ASG spacers 34 on the etched sidewalls of the WSi$_x$ layer 28 and nitride cap 26.

Figure 3:
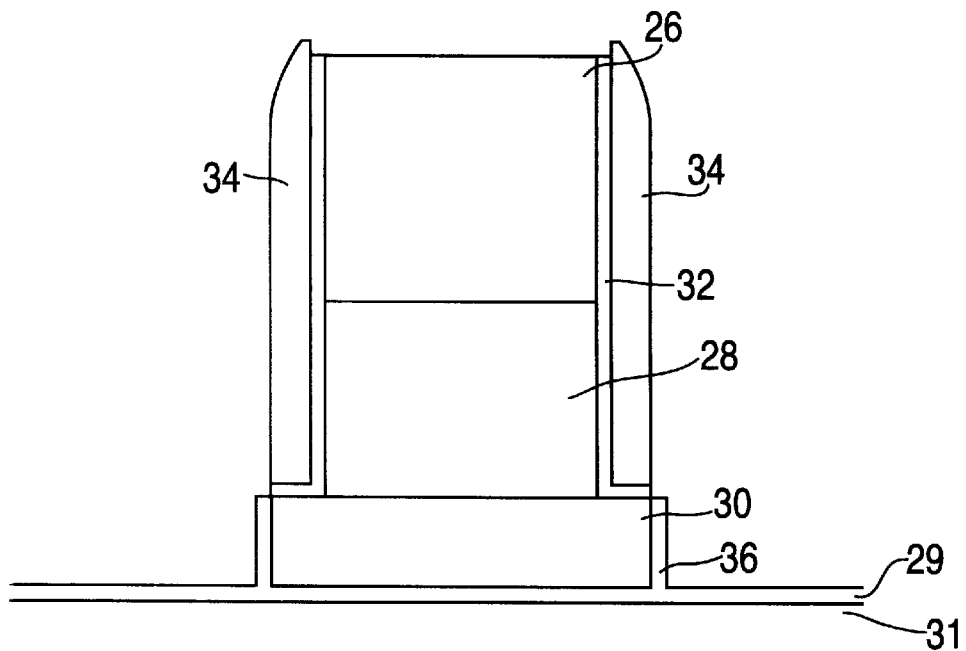

In FIG. 3, the structure of FIG. 2 is selectively etched, using the ASG spacers 34 as a mask, to remove the portion of the exposed thin nitride layer 32. Thus, the underlying N+ polysilicon layer 30 is exposed. The exposed N+ polysilicon layer 30 then is reactive ion etched to the surface of gate oxide 29. A portion of the gate oxide exposed by the etch of the gate conductor 30 also is removed according to customary gate conductor etch practice. A gate conductor sidewall oxide 36 then preferably is grown to replace the removed gate oxide.

Figure 4:
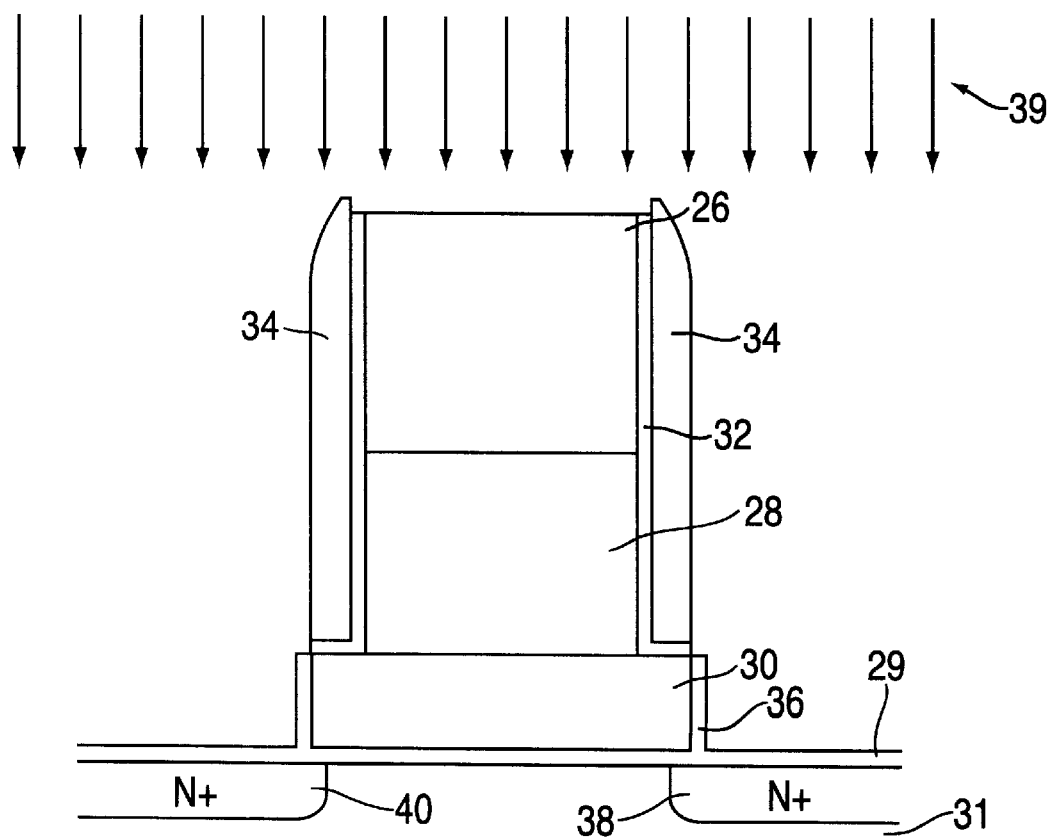

As shown in FIG. 4, at this point in the process, both the node 38 and bitline 40 N+ diffusions are accomplished by N+ implanting 39. This implant is relatively light and is designed to produce an N+ surface concentration in the range of about $5 \times 10^{18}$ to $5 \times 10^{19} \text{cm}^{-3}$. The light implant is needed to satisfy the relatively low doping concentration requirement for the node diffusion, which is one of the prerequisites for low junction leakage. At a subsequent point in the process, as discussed below, a heavier N+ implant may optionally be made only into the bitline diffusion side.

Figure 5:
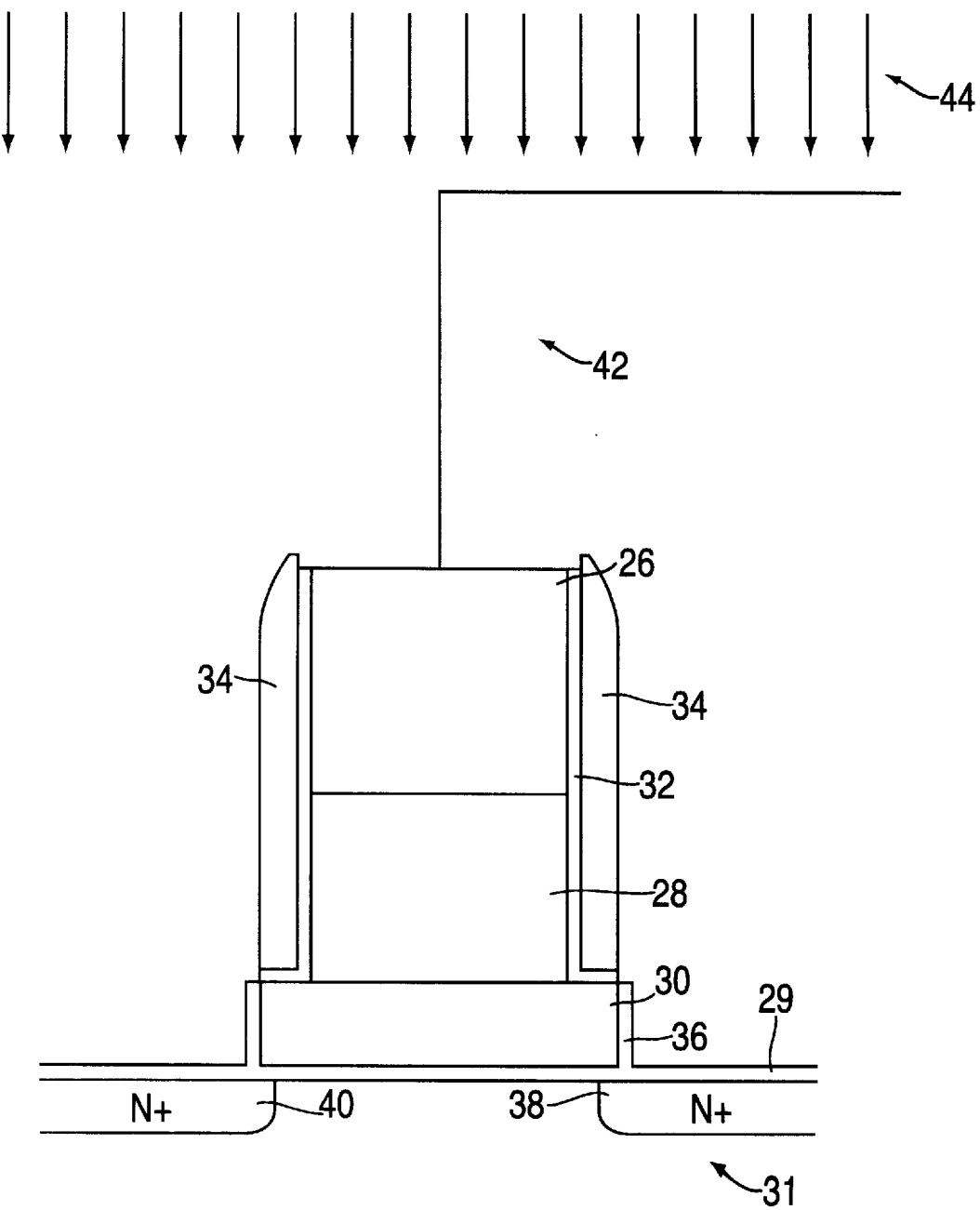

The structure of FIG. 4 then is patterned with a photoresist layer 42, represented in FIG. 5, in a manner such that the bitline diffusion region 40 and the support NFET source drains are opened. The node diffusion region 38 and supporting PFETs are shielded by the photoresist layer 42. A heavier N+ implant 44 optionally may be done at this point to increase the N+ concentration in the bitline diffusion region, in order to facilitate the use of tungsten studs as low resistance bitline contacts. This heavier N+ doping preferably is performed to a concentration of about $5 \times 10^{19}$ to about $1 \times 10^{21} \text{cm}^{-3}$.

Figure 6:
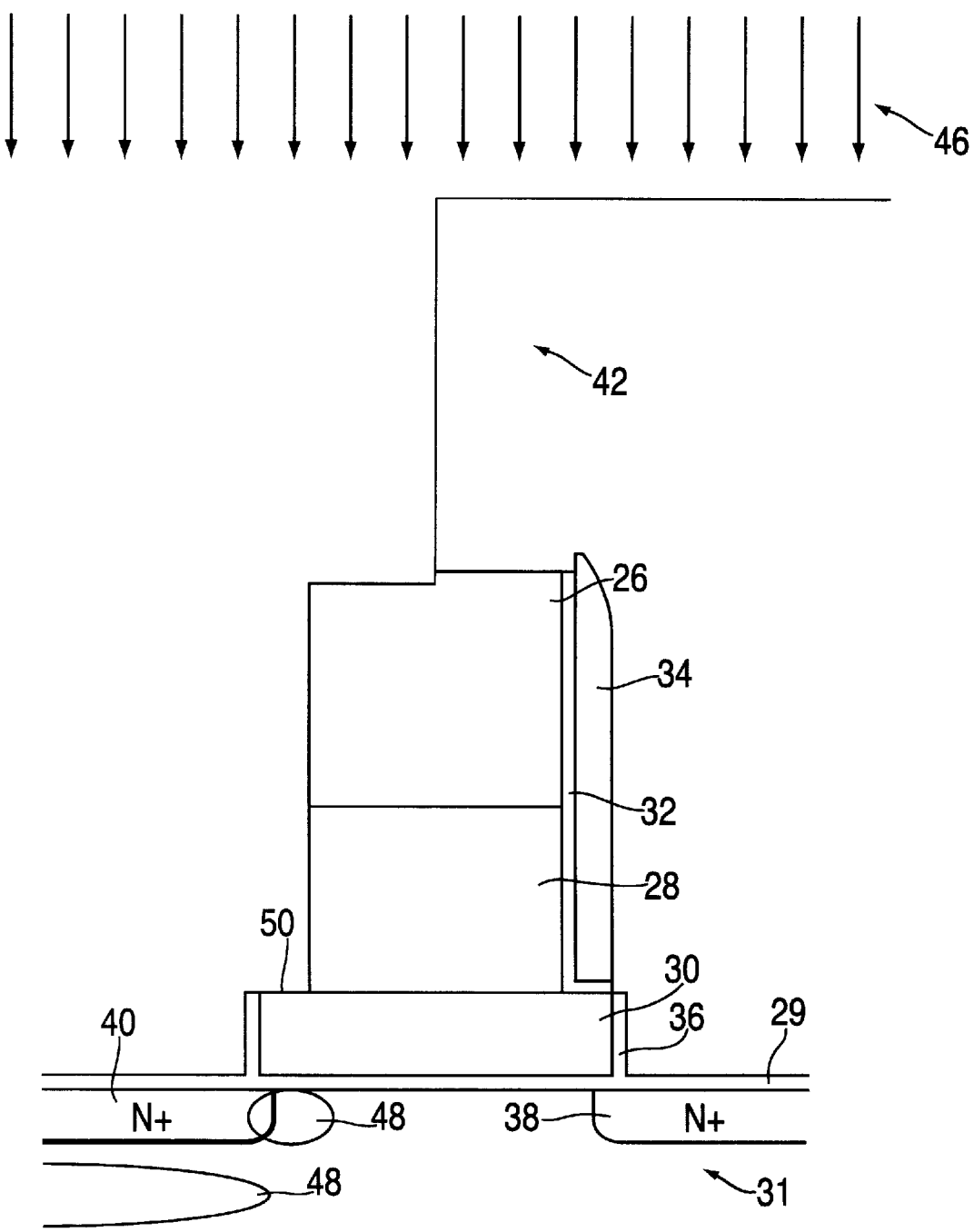

After the optional N+ doping 44 illustrated in FIG. 5, or directly following the application of the photoresist 42 as illustrated in FIG. 5, the exposed ASG spacers 34 are removed with a selective isotropic etch, and boron halo implants 48 are made into the bitline diffusion region and into the support NFET source-drain regions as depicted in FIG. 6. The energy of the dopant 46 preferably is designed such that the peak of the boron distribution 48 under the ledge 50 of the polysilicon 30 is located slightly below the surface of the silicon substrate 31. The polysilicon ledge may have varying thickness, and the dose and energy of the boron implant also may vary accordingly to form the P-type implant pocket. As shown in FIG. 6, the N+ polysilicon ledge 50 preferably has a thickness of about 40 nm. For this thickness of polysilicon, a preferred boron implant energy is about 10 KeV at a dose of about $1.5 \times 10^{13} \text{cm}^{-2}$. The node diffusion region 38 and the support PFET source-drain regions remain protected by the photoresist 42 during implant 46. After completion of the implant, photoresist 42 then is stripped.

Figure 7:
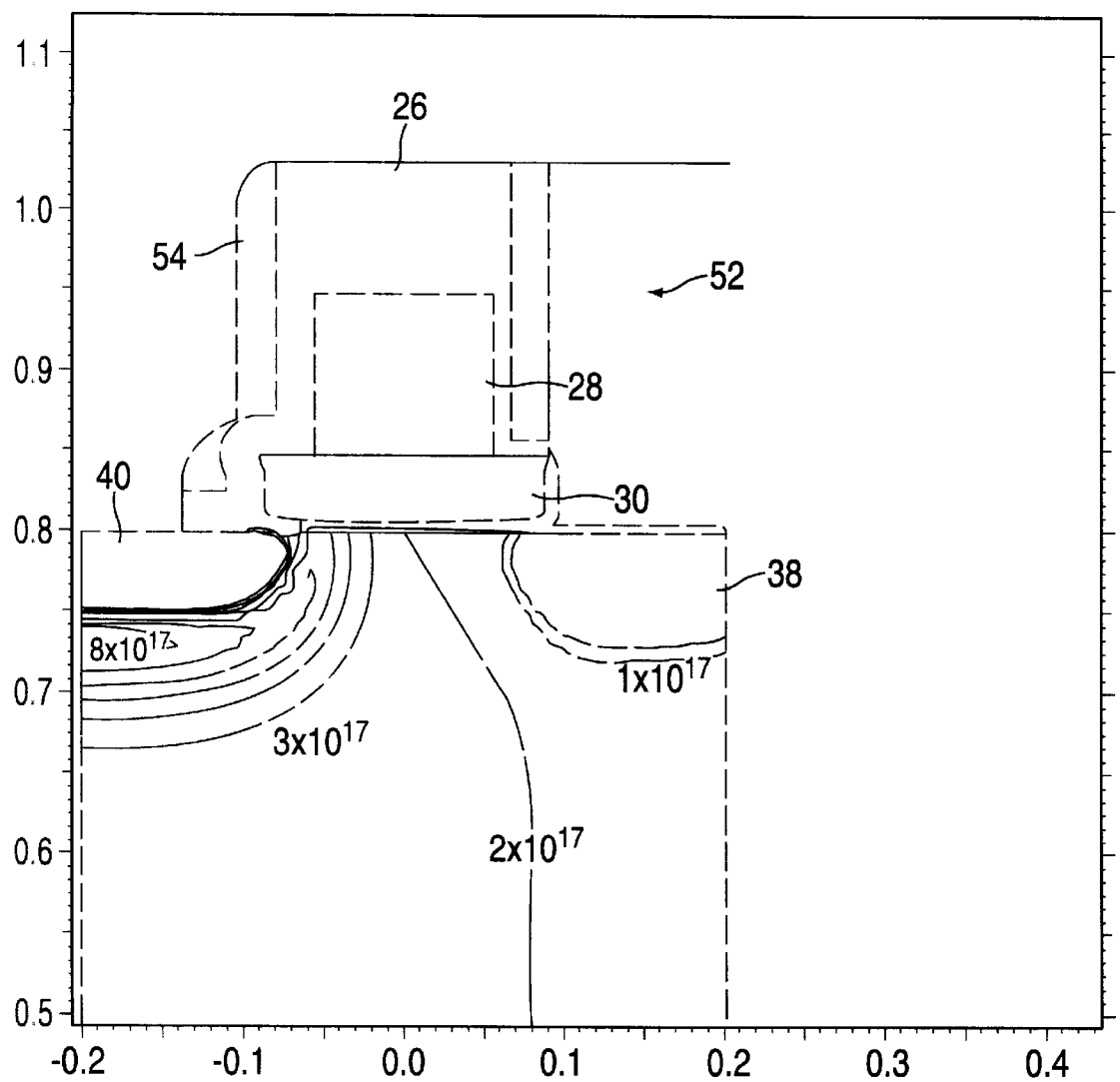

Finally, as shown in FIG. 7, an insulating layer 52 borophosphorus silicate glass (BPSG) is deposited over the structure of FIG. 6, and then planarized to the top of nitride cap 26. The BPSG then was opened to the bitline diffusion 40 by an anisotropic etch selective to nitride and silicon (to allow a borderless contact). A chemical vapor deposition (CVD) nitride layer followed by a CVD oxide layer then were deposited. The CVD oxide layer was reactive ion etched, selective to nitride, to form oxide spacer 54. The nitride exposed by the RIE formation then was removed, selective to oxide, thus exposing the surface of the silicon for the borderless bitline contact. FIG. 7 also illustrates the resulting structure and bitline diffusion with boron halo at the end of all steps which contribute significantly to the thermal budget.

Figure 8:
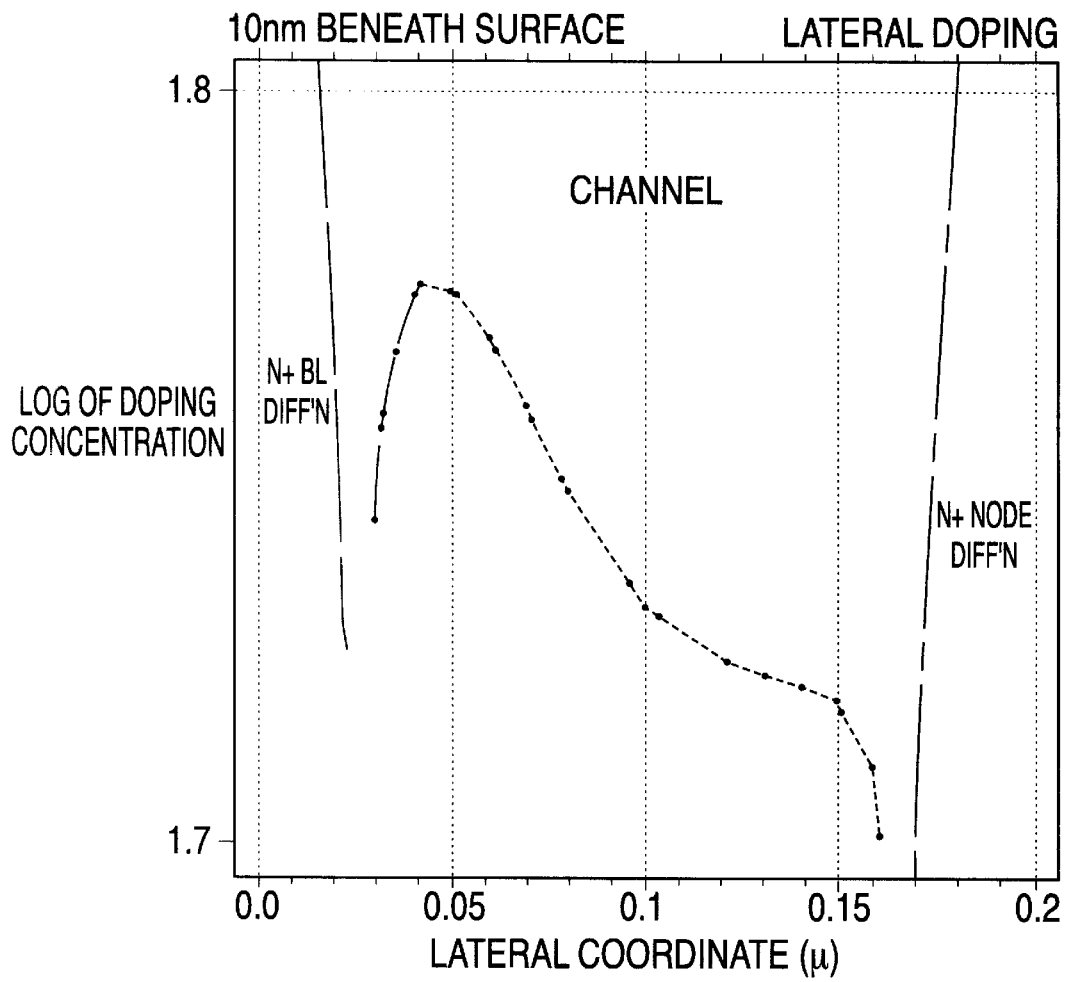
FIG. 8 is a graph representing modeled lateral channel doping profile.

FIG. 8 is a modeled lateral channel doping profile going from bitline to node diffusions, near the top silicon surface under the gate conductor. Note that the profile is strongly peaked near the bitline diffusion and much lower in concentration in the vicinity of the node diffusion. The light doping adjacent the node results in reduced node diffusion leakage and improved retention time yield. The Leff illustrated by this example is approximately 130 nm, demonstrating the scalability of the process.

Figure 9:
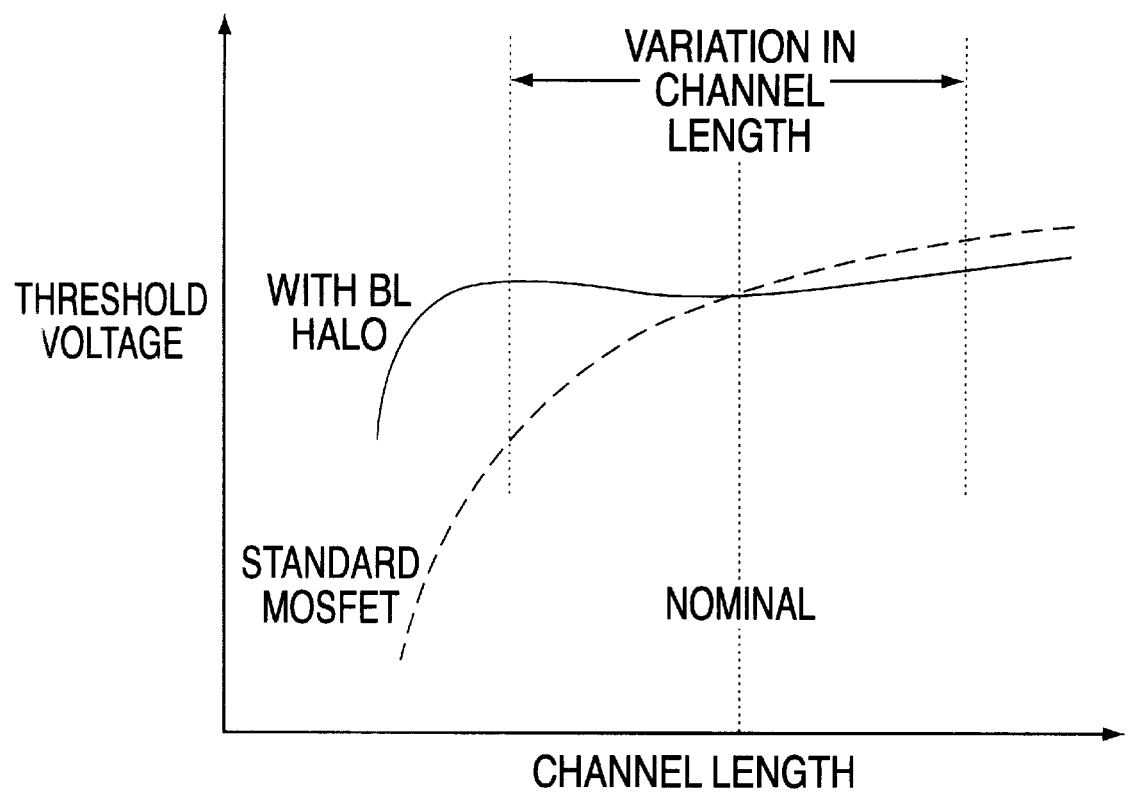
FIG. 9 illustrates the variation of threshold voltage over the range of variation of the channel length of the array MOSFET.

FIG. 9 is an illustration of the variation in threshold voltage ($V_t$) over the range of variation of the channel length of the array MOSFET. Note that the MOSFET containing the bitline halo produces a much smaller variation in $V_t$. For the MOSFET with the bitline halo, the threshold voltage may actually "bump-up" slightly before the onset of strong drain induced barrier lowering (DIBL). As the channel length is reduced, the halo occupies a larger fraction of the channel, thus increasing the average doping concentration over the channel. The distribution of the halo is designed such that the channel doping adjacent the node diffusion is less than what is required for the standard MOSFET, over the entire range of channel length variation.

While the invention has been described with reference to specific embodiments thereof, it is intended that all matter contained in the above description or shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention defined in the appended claims.

What is claimed is:

1. A method of fabricating a MOSFET device for a DRAM cell on a P-type semiconductor substrate including a halo implant region in said MOSFET device, comprising:

providing a semiconductor substrate, a gate insulator layer over said semiconductor substrate, a conductor layer comprising polysilicon, an overlying silicide layer over said conductor layer, and an insulating cap over said silicide layer;

patterning and etching said silicide layer and said insulating cap to expose a portion of the polysilicon conductor layer;

providing insulating spacers comprising spacer material along sides of the patterned silicide layer and insulating cap;

etching the resulting exposed portion of the polysilicon conductor layer;

implanting node and bitline N-type diffusion regions to a first concentration;

patterning a photoresist layer to protect the node diffusion region and expose the bitline diffusion region;

etching resulting exposed spacer material from the side of said silicide layer and insulting cap;

implanting a P-type impurity halo implant into the resulting exposed bitline diffusion region; and stripping the photoresist layer and providing an insulting spacer comprising spacer material along the exposed side of said silicide layer and insulating cap.

2. The method of claim 1 wherein said insulating spacers comprise arsenic silicate glass spacers.

3. The method of claim 1 wherein said silicide layer comprises $WSi_x$.

4. The method of claim 1 wherein after providing the insulating spacers and prior to implanting node and bitline N+ diffusion regions, further comprising etching said conductor layer at areas of said conductor not covered by said spacer material.

5. The method of claim 1 further comprising forming an oxide layer on portions of the substrate and the conductor layer by said etching.

6. The method of claim 1 wherein implanting node and bitline N+ diffusion regions is performed to a surface N+ concentration of about $5\times10^{18}$ to about $5\times10^{19}$ cm$^{-3}$.

7. The method of claim 1 wherein after said patterning of a photoresist layer, and before etching the exposed spacer material, further comprising implanting bitline N+ diffusion to a heavier surface concentration than the first concentration.

8. The method of claim 7 wherein implanting bitline N+ diffusion is performed to a surface N+ concentration of about $5\times10^{19}$ to about $5\times10^{21}$ cm$^{-3}$.

9. The method of claim 1 wherein the implanting of a P-type halo is performed at an energy of about 10 KeV at a dose of about $1.5\times10^{13}$ cm$^{-2}$.

10. A method for fabricating a MOSFET device for a DRAM cell on a P-type semiconductor substrate including a halo implant region in said MOSFET device, comprising:

providing a semiconductor substrate, a gate insulator layer over said semiconductor substrate, a conductor layer comprising polysilicon, an overlying silicide layer over said conductor layer, and an insulating cap over said silicide layer;

patterning and etching said silicide layer and said insulating cap to expose a portion of the polysilicon conductor layer;

providing insulating spacers comprising spacer material along sides of the patterned silicide layer and insulating cap;

etching said conductor layer at areas of said conductor not covered by said spacer material;

implanting node and bitline N-type diffusion region to a first concentration;

patterning a photoresist layer to protect the node diffusion region and PFET source and drain regions and expose the bitline diffusion region and NFET source and drain regions;

implanting the resulting exposed bitline N+ diffusion region to a heavier concentration than the first concentration;

etching resulting exposed spacer material from the side of said silicide layer and insulting cap;

forming an oxide layer on portions of the substrate and conductor layer exposed by said etching;

implanting a P-type impurity halo implant into the resulting exposed bitline diffusion region and supporting NFET source and drain regions; and stripping the photoresist layer and providing an insulting spacer comprising spacer material along the resulting exposed side of said silicide layer and insulting cap.

* * * * *